(12) United States Patent
Ryu et al.

(10) Patent No.: US 11,830,415 B2
(45) Date of Patent: Nov. 28, 2023

(54) DISPLAY DEVICE

(71) Applicant: LG Display Co., Ltd., Seoul (KR)

(72) Inventors: WonSang Ryu, Paju-si (KR); Jin Hee Heo, Paju-si (KR); MoonHo Park, Paju-si (KR); JinSung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 292 days.

(21) Appl. No.: 17/095,470

(22) Filed: Nov. 11, 2020

(65) Prior Publication Data
US 2021/0150977 A1    May 20, 2021

(30) Foreign Application Priority Data

Nov. 18, 2019    (KR) ......................... 10-2019-0147296

(51) Int. Cl.
*G09G 5/00*    (2006.01)
*G09G 3/32*    (2016.01)
*H10K 59/131*    (2023.01)

(52) U.S. Cl.
CPC .......... *G09G 3/32* (2013.01); *H10K 59/1315* (2023.02); *G09G 2300/0809* (2013.01); *G09G 2320/0233* (2013.01)

(58) Field of Classification Search
CPC ... G09G 2300/0426; G09G 2300/0809; G09G 2300/0819; G09G 2300/0842; G09G 2300/0861; G09G 2310/0251; G09G 2320/0233; G09G 3/32; G09G 3/3233; H01L 27/3246; H01L 27/3276; H01L 27/3279

See application file for complete search history.

(56) References Cited

U.S. PATENT DOCUMENTS

2018/0254008 A1\*   9/2018   Toyomura ............ G09G 3/3233
2019/0280076 A1\*   9/2019   Bang .................. H01L 27/3265

FOREIGN PATENT DOCUMENTS

KR        20150066693 A        6/2015

\* cited by examiner

*Primary Examiner* — Insa Sadio
(74) *Attorney, Agent, or Firm* — SEED IP LAW GROUP LLP

(57) ABSTRACT

Embodiments of the disclosure concern display devices. The voltage line for supplying driving voltage to the cathode electrode of the light emitting element in the subpixel and the voltage line for supplying voltage for initializing the subpixel are integrated together. This allows for use of fewer voltage lines in the active area, along with easier arrangement of the voltage lines. The wire resistance may be reduced by adjusting the width of the voltage lines. The reduction in wire resistance may decrease brightness deviation or increase the aperture ratio or transmittance of the subpixel, thus allowing the display device higher light emission efficiency or transmittance.

18 Claims, 17 Drawing Sheets

Display Type 1

Display Type 2

Display Type 3

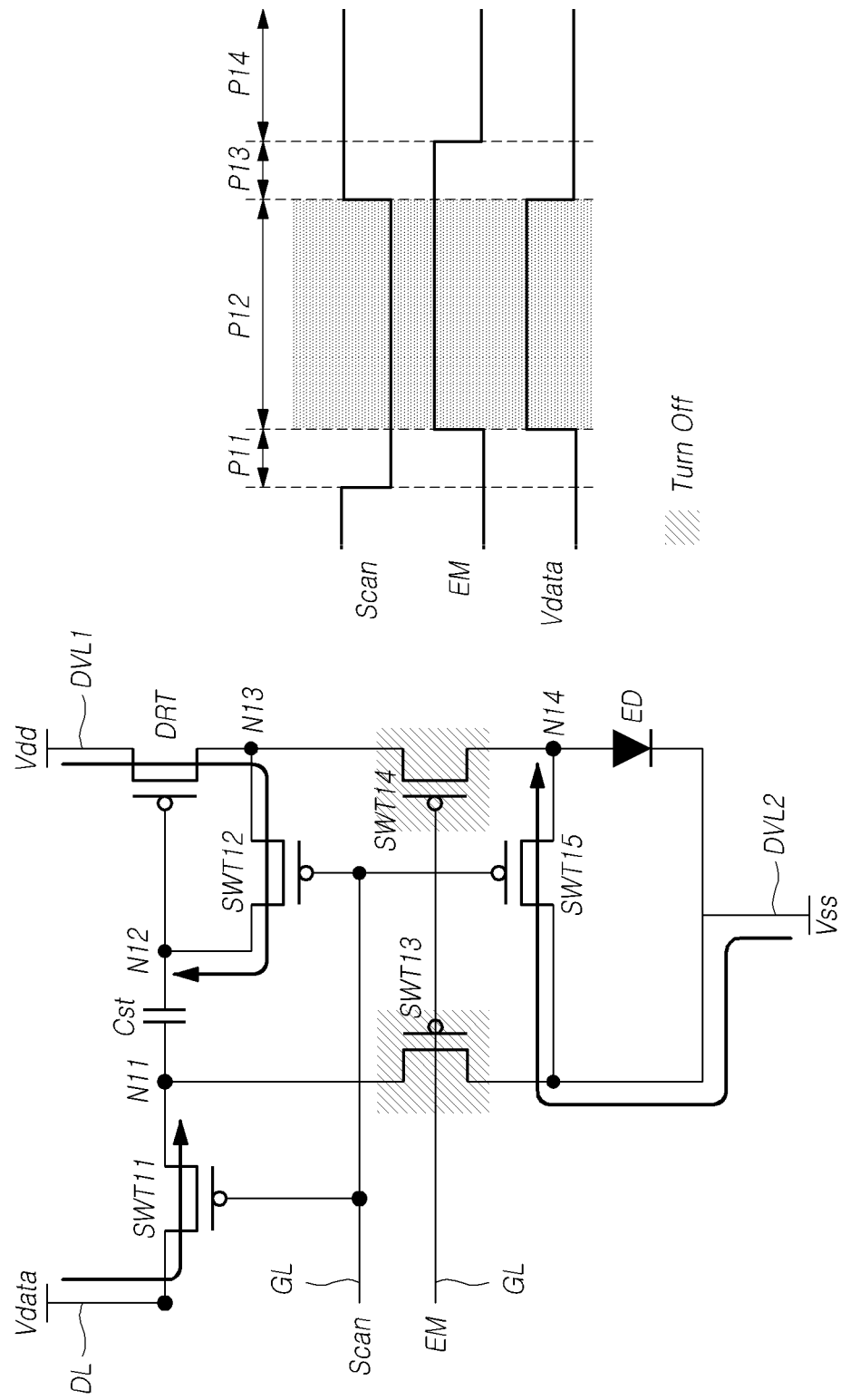

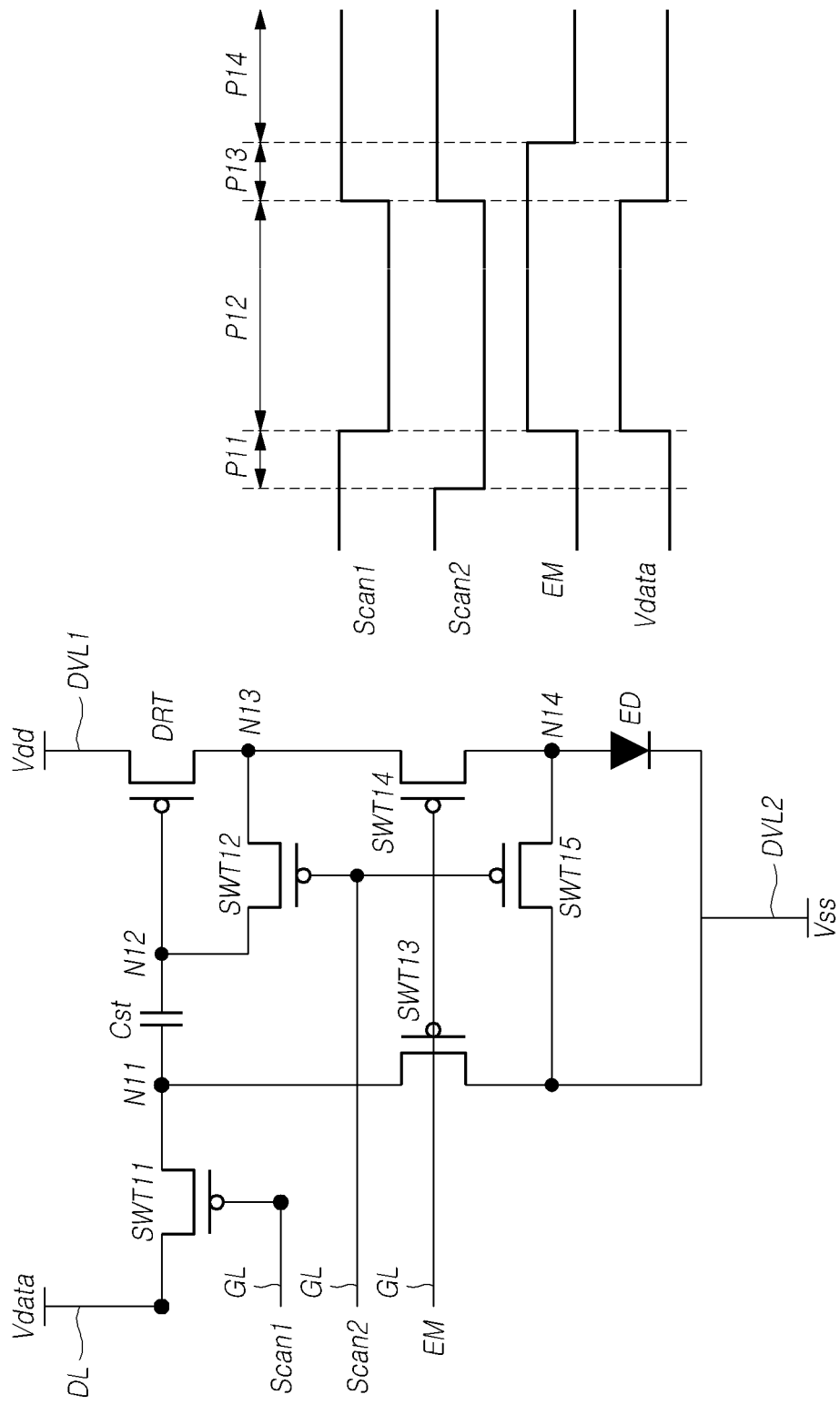

DISPLAY DEVICE

CROSS REFERENCE TO RELATED APPLICATION

This application claims priority from Korean Patent Application No. 10-2019-0147296, filed on Nov. 18, 2019, which is hereby incorporated by reference for all purposes as if fully set forth herein.

BACKGROUND

Technical Field

Embodiments of the disclosure relate to display devices.

Description of the Related Art

The growth of the intelligent society leads to increased demand for image display devices and use of various types of display devices, such as liquid crystal displays, organic light emitting displays, etc.

A display device may include a display panel with various signal lines and multiple subpixels and a diversity of driving circuits for driving the signal lines. Each subpixel may include, e.g., a light emitting element and a circuit element for driving the light emitting element.

A voltage for driving the subpixels may be supplied via some of the signal lines. The level of the driving voltage may be varied depending on differences in, e.g., the resistance, of the signal lines due to the positions of the subpixels in the display panel.

This may result in brightness deviations due to the positions of the subpixels. In particular, large-size or high-resolution displays may suffer from quality deterioration due to variations in the level of the driving voltage.

The variations in driving voltage level per area may be reduced by widening the signal lines. However, this way may reduce the aperture ratio of the subpixel. Thus, a need exists for a method for placing signal lines while enhancing the quality of a display.

BRIEF SUMMARY

Embodiments of the disclosure provide a method for reducing the number of signal lines supplying voltage to the subpixels of a display device and driving the subpixels using fewer signal lines.

Embodiments of the disclosure provide a method for preventing variations in the level of driving voltage supplied to the subpixels while maintaining the aperture ratio or transmittance of the subpixels.

According to various embodiments of the disclosure, a display device comprises a display panel including, disposed thereon, a plurality of gate lines, a plurality of data lines, and a plurality of subpixels, at least one first driving voltage line supplying a first driving voltage to the plurality of subpixels, and at least one second driving voltage line supplying a second driving voltage to the plurality of subpixels, the at least one second driving voltage line electrically connected with a cathode electrode of a light emitting element disposed in the subpixels and electrically connected with an anode electrode of the light emitting element via at least one thin film transistor.

According to various embodiments of the disclosure, a display device comprises a display panel including, disposed thereon, a plurality of gate lines, a plurality of data lines, and a plurality of subpixels, at least one first driving voltage line supplying a first driving voltage to the plurality of subpixels, and at least one second driving voltage line supplying a second driving voltage to the plurality of subpixels, the at least one second driving voltage line electrically connected with a cathode electrode of a light emitting element disposed in the subpixels and electrically connected with a capacitor disposed in the subpixels via at least one thin film transistor.

According to various embodiments of the disclosure, a display device comprises a plurality of subpixels each of which including a light emitting element and a plurality of thin film transistors and at least one driving voltage line electrically connected with an anode electrode of the light emitting element via at least one thin film transistor among the plurality of thin film transistors and cathode electrode of the light emitting element. The driving voltage line may supply the same voltage as that supplied to the cathode electrode of the light emitting element to the anode electrode of the light emitting element during some of display driving periods.

According to various embodiments of the disclosure, a voltage for initializing the light emitting elements may be supplied via voltage lines for supplying driving voltage to the cathode electrodes of the light emitting elements. This enables to drive the subpixels with a reduced number of signal lines for supplying voltage to the subpixels.

According to various embodiments of the disclosure, the width of signal lines for supplying voltage to the subpixels may be increased by reducing signal lines for supplying voltage for initializing the light emitting elements. Thus, variations in driving voltage level may be minimized or reduced, and image quality deterioration due to variations in driving voltage level may be prevented or decreased.

BRIEF DESCRIPTION OF THE DRAWINGS

The above and other objects, features, and advantages of the present disclosure will be more clearly understood from the following detailed description, taken in conjunction with the accompanying drawings, in which:

FIGS. 4A, 4B, 4C, and 4D are views illustrating an example scheme of driving a subpixel as shown in FIG. 3;

FIG. 5 is a view illustrating another example circuit structure of a subpixel disposed in a display device according to various embodiments of the disclosure;

DETAILED DESCRIPTION

Figure 1:
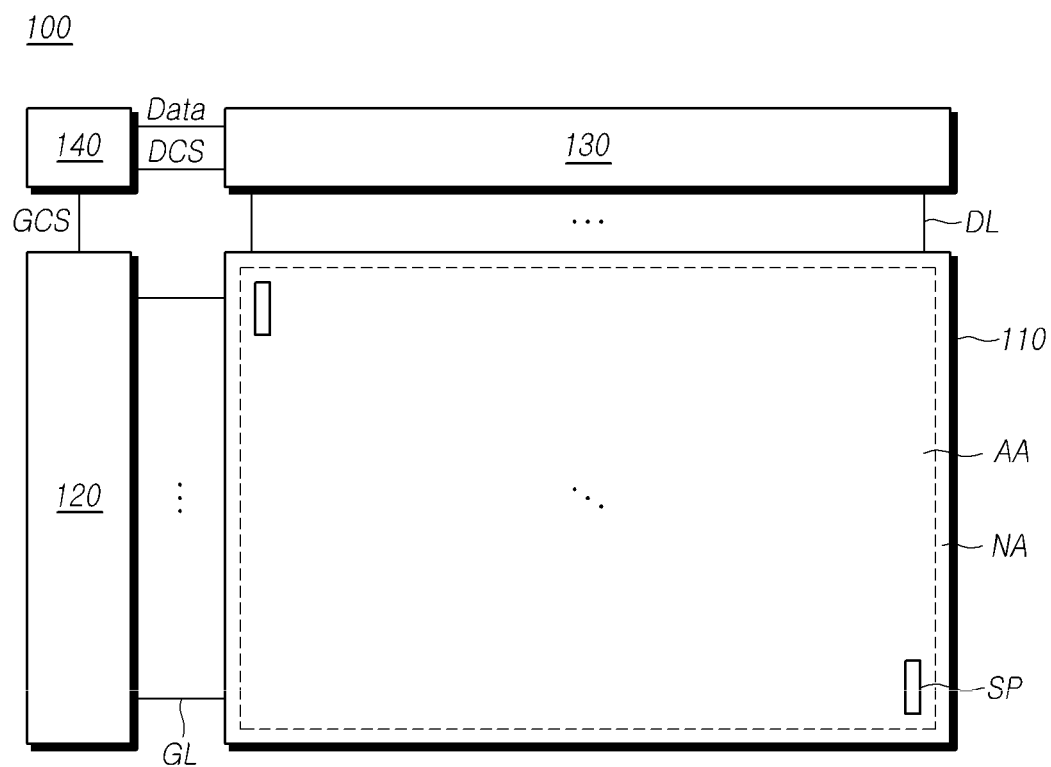
FIG. 1 is a view schematically illustrating a configuration of a display device according to various embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps" etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a view schematically illustrating a configuration of a display device 100 according to various embodiments of the disclosure.

Referring to FIG. 1, a display device 100 may include a display panel 110 including an active area AA for displaying images and a non-active area NA around the active area AA, a gate driving circuit 120, a data driving circuit 130, and a controller 140 for driving the display panel 110.

The display panel 110 may include a plurality of gate lines GL, a plurality of data lines DL, and subpixels SP at the crossings of the gate lines GL and the data lines DL. Each subpixel SP may include several circuit elements. Two or more subpixels SP may constitute one pixel.

The gate driving circuit 120 may be controlled by the controller 140 to sequentially output scan signals to the plurality of gate lines GL disposed in the display panel 110, controlling the driving timing of the subpixels SP.

The gate driving circuit 120 may output a light emission signal for controlling the light emission timing of the subpixels SP. A circuit for outputting scan signals and a circuit for outputting light emission signals may be implemented as a single circuit or separate circuits.

The gate driving circuit 120 may include one or more gate driver integrated circuits (GDICs). Depending on driving schemes, the gate driving circuit 120 may be positioned on only one side, or each of two opposite sides, of the display panel 110. The gate driving circuit 120 may be implemented in a gate-in-panel form which is disposed in the bezel area of the display panel 110.

The data driving circuit 130 receives image data from the controller 140 and converts the image data into an analog data voltage. The data driving circuit 130 outputs a data voltage to each data line DL according to the timing of applying a scan signal via the gate line GL, allowing each subpixel SP to represent a brightness according to the image data.

The data driving circuit 130 may include one or more source driver integrated circuits (SDICs). The data driving circuit 130 may be positioned on only one side, or each of two opposite sides, of the display panel 110.

The controller 140 supplies various control signals to the gate driving circuit 120 and the data driving circuit 130 and controls the operation of the gate driving circuit 120 and the data driving circuit 130.

The controller 140 enables the gate driving circuit 120 to output scan signals according to the timing of implementing each frame, converts image data received from the outside to meet the data signal format used by the data driving circuit 130, and outputs the resultant image data to the data driving circuit 130.

The controller 140 receives, from the outside (e.g., a host system), various timing signals including a vertical synchronization signal VSYNC, a horizontal synchronization signal HSYNC, an input data enable signal DE, and a clock signal, along with the image data.

The controller 140 may generate a diversity of control signals using the timing signals received from the outside and output the control signals to the gate driving circuit 120 and the data driving circuit 130.

As an example, to control the gate driving circuit 120, the controller 140 outputs various gate control signals GCS including a gate start pulse GSP, a gate shift clock GSC, and a gate output enable signal GOE.

The gate start pulse GSP controls the operation start timing of one or more gate driver integrated circuits GDICs constituting the gate driving circuit 120. The gate shift clock GSC is a clock signal commonly input to one or more gate driver integrated circuits GDICs and controls the shift timing of the scan signals. The gate output enable signal GOE designates timing information about one or more gate driver integrated circuits GDICs.

To control the data driving circuit 130, the controller 140 outputs various data control signals DCS including, e.g., a source start pulse SSP, a source sampling clock SSC, and a source output enable signal SOE.

The source start pulse SSP controls the data sampling start timing of one or more source driver integrated circuits SDICs constituting the data driving circuit 130. The source sampling clock SSC is a clock signal for controlling the sampling timing of data in each source driver integrated circuit (SDIC). The source output enable signal SOE controls the output timing of the data driving circuit 130.

The display device 100 may further include a power management integrated circuit that supplies various voltages or currents to, e.g., the display panel 110, the gate driving circuit 120, and the data driving circuit 130 or controls various voltages or currents to be supplied.

The display panel 110 may include voltage lines for supplying various signals or voltages in addition to the gate lines GL and the data lines DL. Driving voltage, such as high-potential voltage or low-potential voltage, for driving the light emitting elements ED in the subpixels SP may be supplied via some of the voltage lines.

Figure 2A:
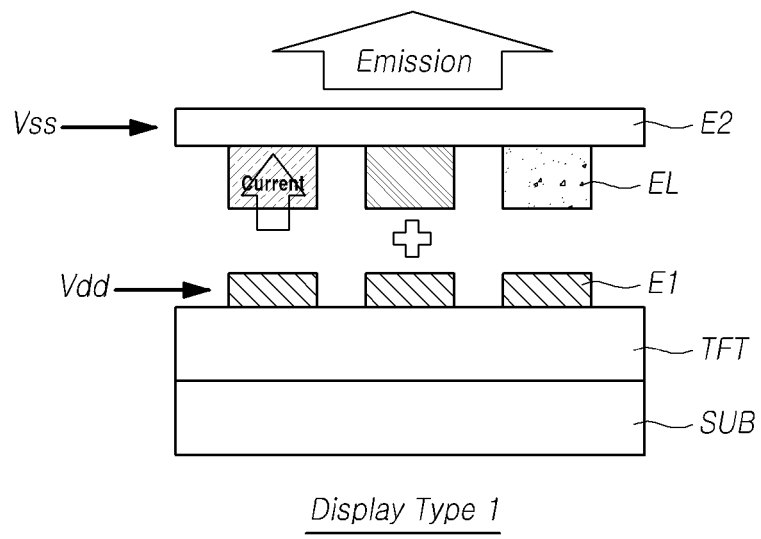
FIGS. 2A, 2B, and 2C are views schematically illustrating a structure of supplying driving voltage to a light emitting element in a display device according to various embodiments of the disclosure.
Figure 2B:
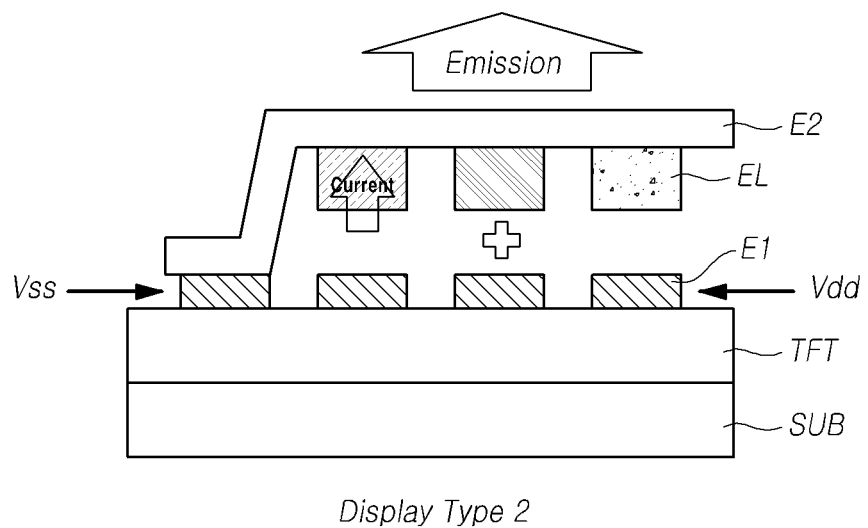
Figure 2C:
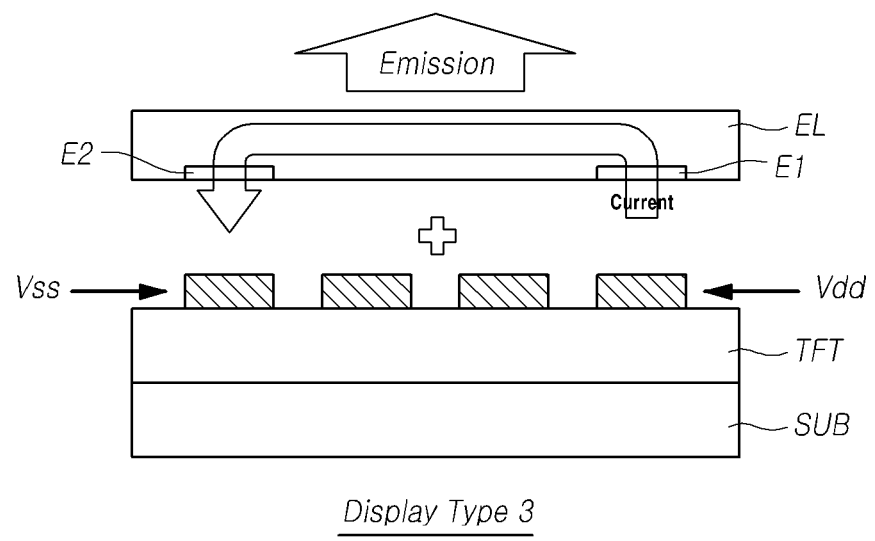

FIGS. 2A to 2C are views schematically illustrating a structure of supplying driving voltage to a light emitting element ED in a display device 100 according to various embodiments of the disclosure.

Referring to FIG. 2A, a thin film transistor (TFT) layer where various circuit elements, e.g., TFTs, for driving subpixels SP and signal lines are formed may be disposed on a substrate SUB. A light emitting element including a first electrode E1, a light emitting layer EL, and a second electrode E2 may be disposed on the TFT layer.

The light emitting element ED may be, but is not limited to, an organic light emitting diode (OLED), as an example.

The first electrode E1 of the light emitting element ED may be electrically connected with a voltage line for supplying a first driving voltage Vdd which is a high-potential voltage. The second electrode E2 of the light emitting element ED may be electrically connected with a voltage line for supplying a second driving voltage Vss which is a low-potential voltage.

In the state where the first driving voltage Vdd and the second driving voltage Vss may be supplied to the subpixel SP, the driving current supplied to the light emitting element ED may be adjusted depending on the data voltage Vdata supplied to the subpixel SP, and the subpixel SP may represent a brightness corresponding to the data voltage Vdata.

At this time, light from the light emitting element ED may be radiated to the second electrode E2 of the light emitting element ED. The second electrode E2 of the light emitting element ED may be formed of a transparent material that may have a high resistance.

In such a case, an auxiliary wire for supplying the second driving voltage Vss may be added to reduce the resistance of the second electrode E2 of the light emitting element ED.

Referring to FIG. 2B, a TFT layer and a light emitting element ED may be disposed on a substrate SUB. An auxiliary wire for supplying the second driving voltage Vss may be included in, or disposed on, the TFT layer.

The auxiliary wire may be electrically connected with the second electrode E2 of the light emitting element ED and may be disposed in, e.g., the active area AA. Thus, the placement of the auxiliary wire may reduce the resistance of the second electrode E2 of the light emitting element ED but may decrease the aperture ratio of the subpixel SP.

Although the display device 100 is of a different type, a voltage line for supplying the second driving voltage Vss may be disposed in the active area AA of the display panel 110.

Referring to FIG. 2C, a voltage line for supplying the first driving voltage Vdd and the second driving voltage Vss to the subpixel SP may be included in, or disposed on, the TFT layer. A light emitting element including a first electrode E1, a light emitting layer EL, and a second electrode E2 may be disposed.

For example, the light emitting element ED may be a light emitting diode (LED) or a micro LED (μLED) which is a few tens of micrometers (μm) in size.

In such a case, the voltage line for supplying the first driving voltage Vdd or second driving voltage Vss may be disposed in the active area AA of the display panel 110, and the area where the voltage line occupies in the active area AA may increase.

According to various embodiments of the disclosure, there is provided a scheme for mitigating image quality deterioration due to variations in driving voltage level that may be caused by the resistance of the voltage line while preventing a reduction in the aperture ratio of the subpixel SP due to the placement of a voltage line that may be needed to be placed to supply driving voltage to the display panel 110.

Figure 3:
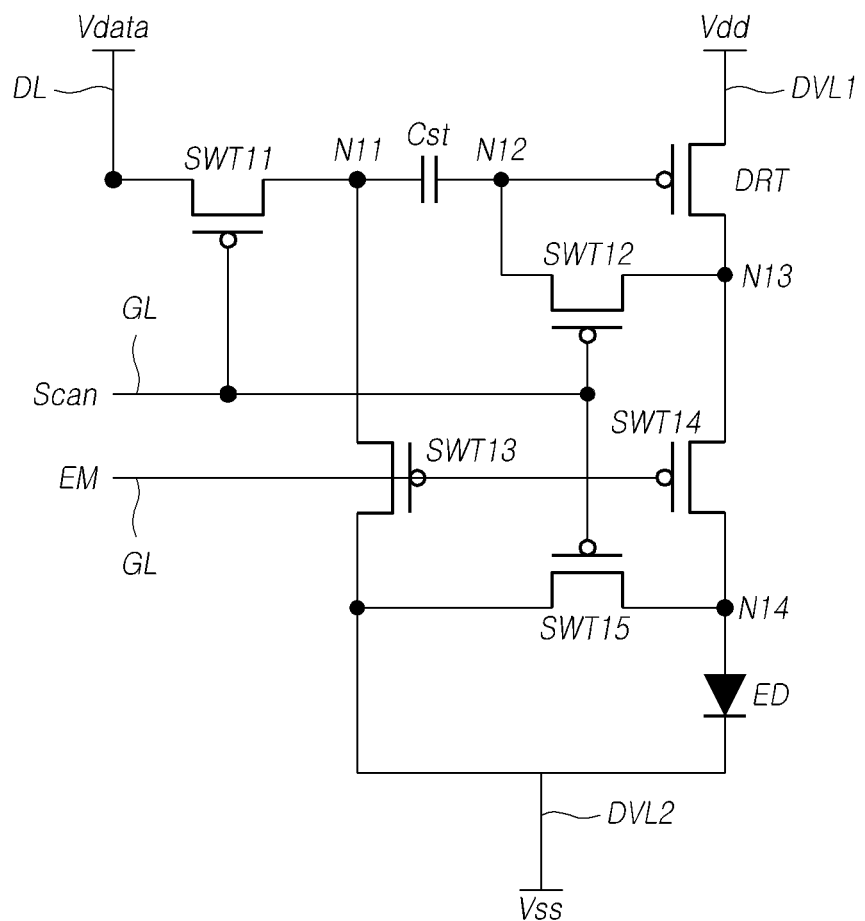
FIG. 3 is a view illustrating an example circuit structure of a subpixel disposed in a display device according to various embodiments of the disclosure.

FIG. 3 is a view illustrating an example circuit structure of a subpixel SP disposed in a display device 100 according to various embodiments of the disclosure.

Referring to FIG. 3, a light emitting element ED and a driving transistor DRT for controlling driving current supplied to the light emitting element ED may be disposed in a subpixel SP. At least one switching transistor SWT may be disposed in the subpixel SP. A capacitor Cst may be disposed in the subpixel SP to maintain the data voltage Vdata during a frame period.

The number of switching transistors SWT disposed in the subpixel SP may be varied. FIG. 3 illustrates an example structure in which five switching transistors SWT are disposed in the subpixel SP. In other words, FIG. 3 illustrates an example of a 6T1C structure in which the subpixel SP includes five switching transistors SWT, one driving transistor DRT, and one capacitor Cst.

Although FIG. 3 illustrates P-type thin film transistors, N-type thin film transfers may be disposed depending on cases. At least some of the switching transistors SWT may have a structure (e.g., a dual structure) in which a plurality of thin film transistors are connected together.

A first switching transistor SWT11 may be electrically connected between a first data line DL and a first node N11. The first switching transistor SWT11 may be controlled by a scan signal Scan supplied to a gate line GL. The first switching transistor SWT11 may control application of data voltage Vdata to the first node N11.

A second switching transistor SWT12 may be electrically connected between a second node N12 and a third node N13. The second switching transistor SWT12 may be controlled by the scan signal Scan supplied to the gate line GL.

A third switching transistor SWT13 may be electrically connected between a second driving voltage line DVL2 and the first node N11. A fourth switching transistor SWT14 may be electrically connected between the third node N13 and a fourth node N14. The third switching transistor SWT13 and the fourth switching transistor SWT14 may be controlled by a light emitting signal EM supplied to the gate line GL.

A fifth switching transistor SWT15 may be electrically connected between the second driving voltage line DVL2 and the fourth node N14. The fifth switching transistor SWT15 may be controlled by the scan signal Scan supplied to the gate line GL.

The driving transistor DRT may be electrically connected between the first driving voltage line DVL1 and the third node N13. The driving transistor DRT may be controlled by the voltage level of the second node N12.

The capacitor Cst may be electrically connected between the first node N11 and the second node N12. The light emitting element ED may be electrically connected between the fourth node N14 and the second driving voltage line DVL2.

The second driving voltage line DVL2 may be electrically connected with the cathode electrode, which is the second electrode E2, of the light emitting element ED and supply the second driving voltage Vss to the cathode electrode of the light emitting element ED.

The second driving voltage line DVL2 may be electrically connected with the anode electrode, which is the first electrode E1, of the light emitting element ED via at least one switching transistor SWT. In other words, as shown in FIG. 3, the second driving voltage line DVL2 may be electrically connected with the anode electrode of the light emitting element ED via the fifth switching transistor SWT15.

The second driving voltage line DVL2 may be electrically connected with the capacitor Cst disposed in the subpixel SP via at least one switching transistor SWT. In other words, as shown in FIG. 3, the second driving voltage line DVL2 may be electrically connected with the capacitor Cst via the third switching transistor SWT13.

As such, as the second driving voltage line DVL2 is electrically connected with, e.g., the capacitor Cst and the anode electrode of the light emitting element ED disposed in the subpixel SP, the anode electrode of the light emitting element ED may be initialized by the second driving voltage Vss supplied via the second driving voltage line DVL2.

This allows for a structure that may drive the subpixels SP with a reduced number of voltage lines. As the number of voltage lines is reduced, the width of some voltage lines may be increased to reduce resistance or to easily prevent adjacent voltage lines from being shorted.

FIGS. 4A to 4D are views illustrating an example scheme of driving a subpixel SP as shown in FIG. 3.

Figure 4A:
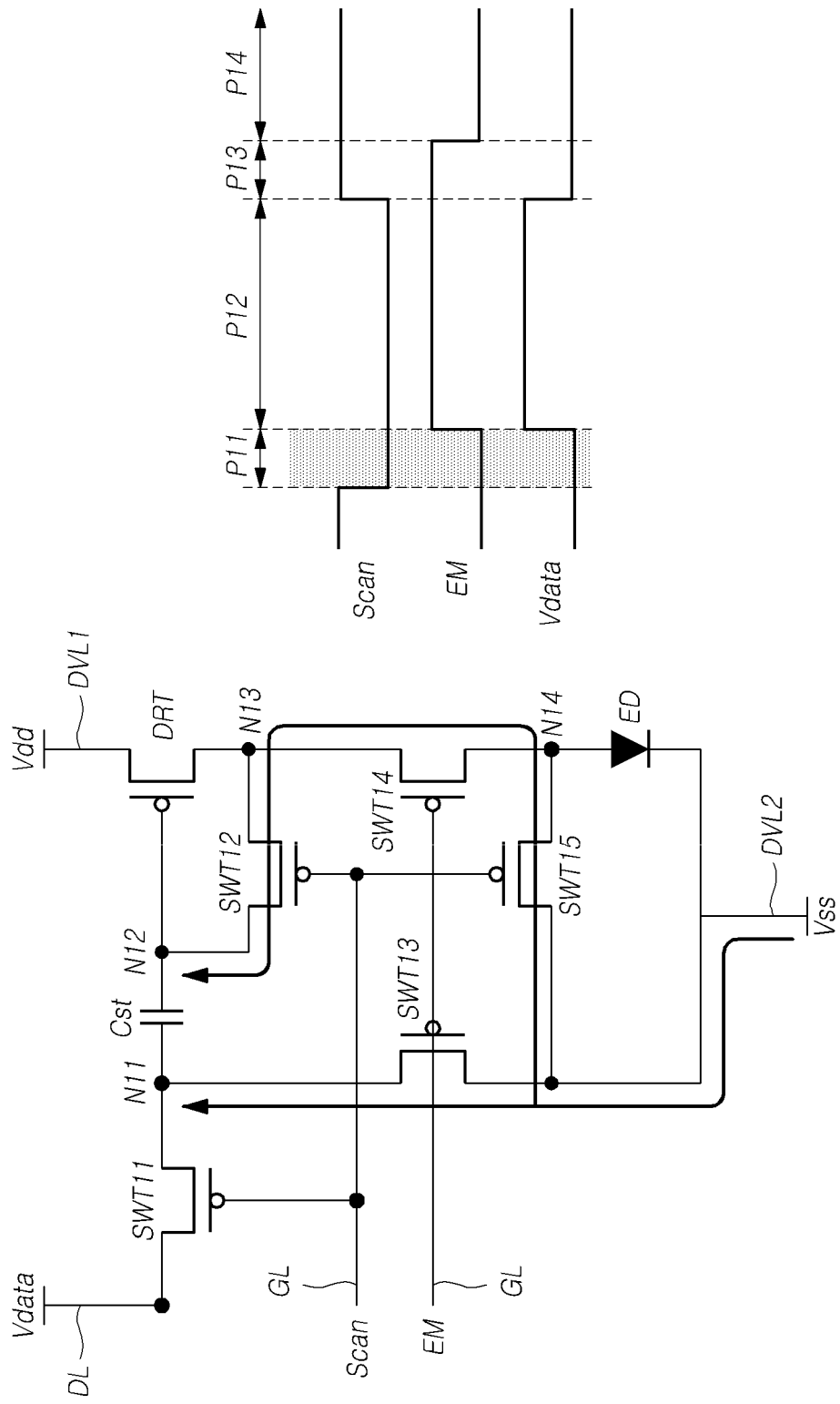

Referring to FIG. 4A, a low-level scan signal Scan is supplied via a gate line GL during a first period P11. Thus, the second switching transistor SWT12 and the fifth switching transistor SWT15 may be turned on.

A low-level light emitting signal EM is supplied to the gate line GL during the first period P11. Thus, the third switching transistor SWT13 and the fourth switching transistor SWT14 may be turned on.

As the third switching transistor SWT13 is turned on, the second driving voltage Vss may be supplied to the first node N11. As the second switching transistor SWT12, fourth switching transistor SWT14, and fifth switching transistor SWT15 are turned on, the second driving voltage Vss may be supplied to the second node N12.

Thus, during the first period P11, the first node N11 and the second node N12 may be initialized by the second driving voltage Vss. The first period P11 may be referred to as an "initialization period."

Referring to FIG. 4B, the scan signal Scan supplied to the gate line GL during the second period P12 may remain at a low level, and the light emitting signal EM may turn into a high level.

As the light emitting signal EM turns into the high level, the third switching transistor SWT13 and the fourth switching transistor SWT14 may be turned off.

During the second period P12, data voltage Vdata may be supplied to the data line DL. As the first switching transistor SWT11 has been turned on by the low-level scan signal scan, the data voltage Vdata may be supplied to the first node N11.

As the second switching transistor SWT12 has been turned on by the low-level scan signal Scan, the first driving voltage Vdd may be supplied to the second node N12 via the driving transistor DRT and the second switching transistor SWT12.

At this time, the first driving voltage Vdd subtracted by the threshold voltage Vth of the driving transistor DRT may be applied to the second node N12. Thus, compensation may be performed on the threshold voltage Vth of the driving transistor DRT.

As the fifth switching transistor SWT15 has been turned on by the low-levels scan signal Scan, the fourth node N14, i.e., the anode electrode of the light emitting element ED, may be initialized by the second driving voltage Vss.

Thus, during the second period P12, the first node N11 may be in the state of having the data voltage Vdata applied thereto, and the second node N12 may be in the state of having the first driving voltage Vdd subtracted by the threshold voltage Vth of the driving transistor DRT applied thereto. The second period may be referred to as a "programming period."

Figure 4C:
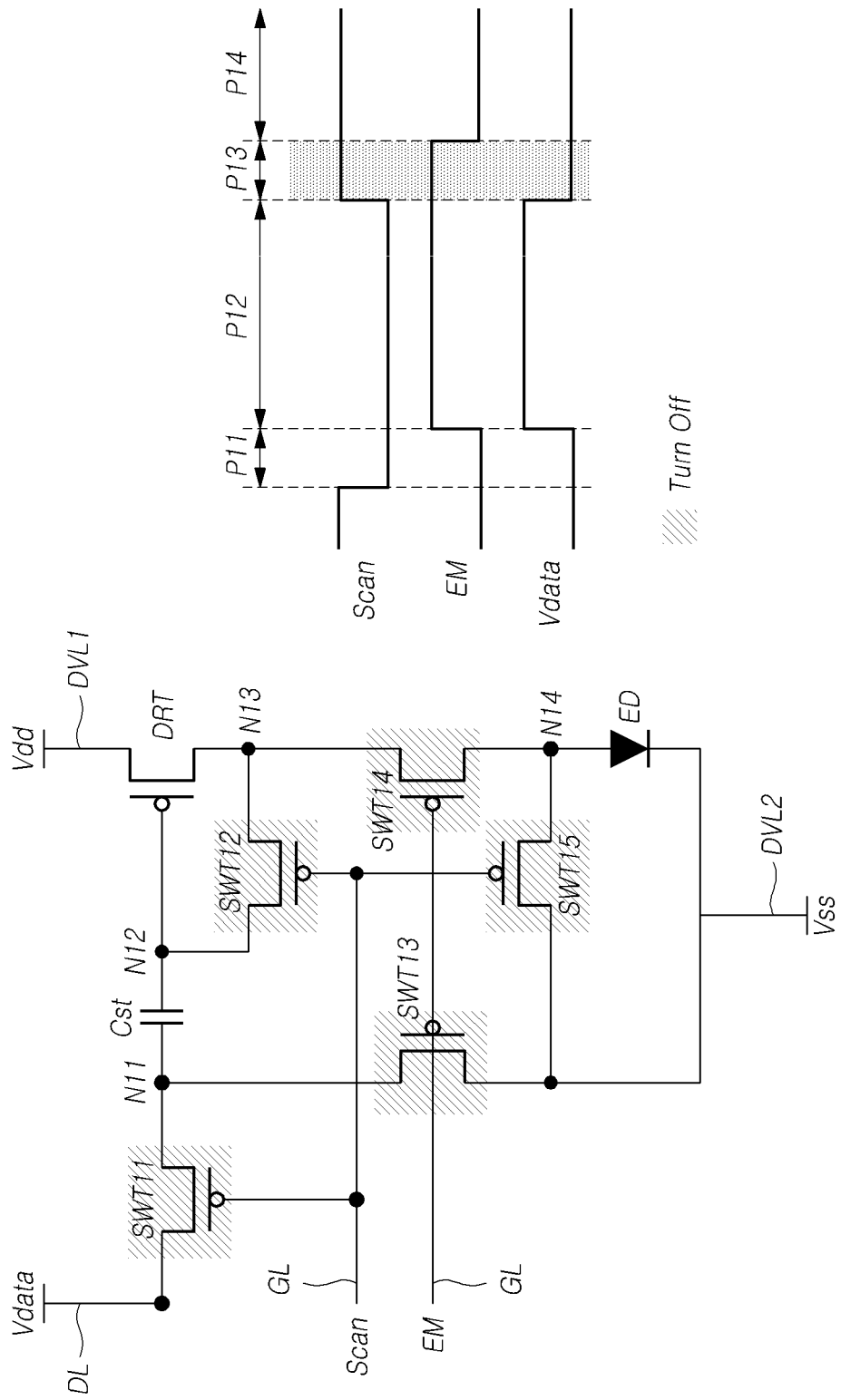

Referring to FIG. 4C, during a third period P13, the supply of the data voltage Vdata may be stopped, and a high-level scan signal Scan and light emitting signal EM may be supplied. Thus, all of the switching transistors SWT may be turned off. The first node N11 and the second node N12 may remain at the voltage level of the second period P12.

The third period P13 may be referred to as a "holding period."

Figure 4D:
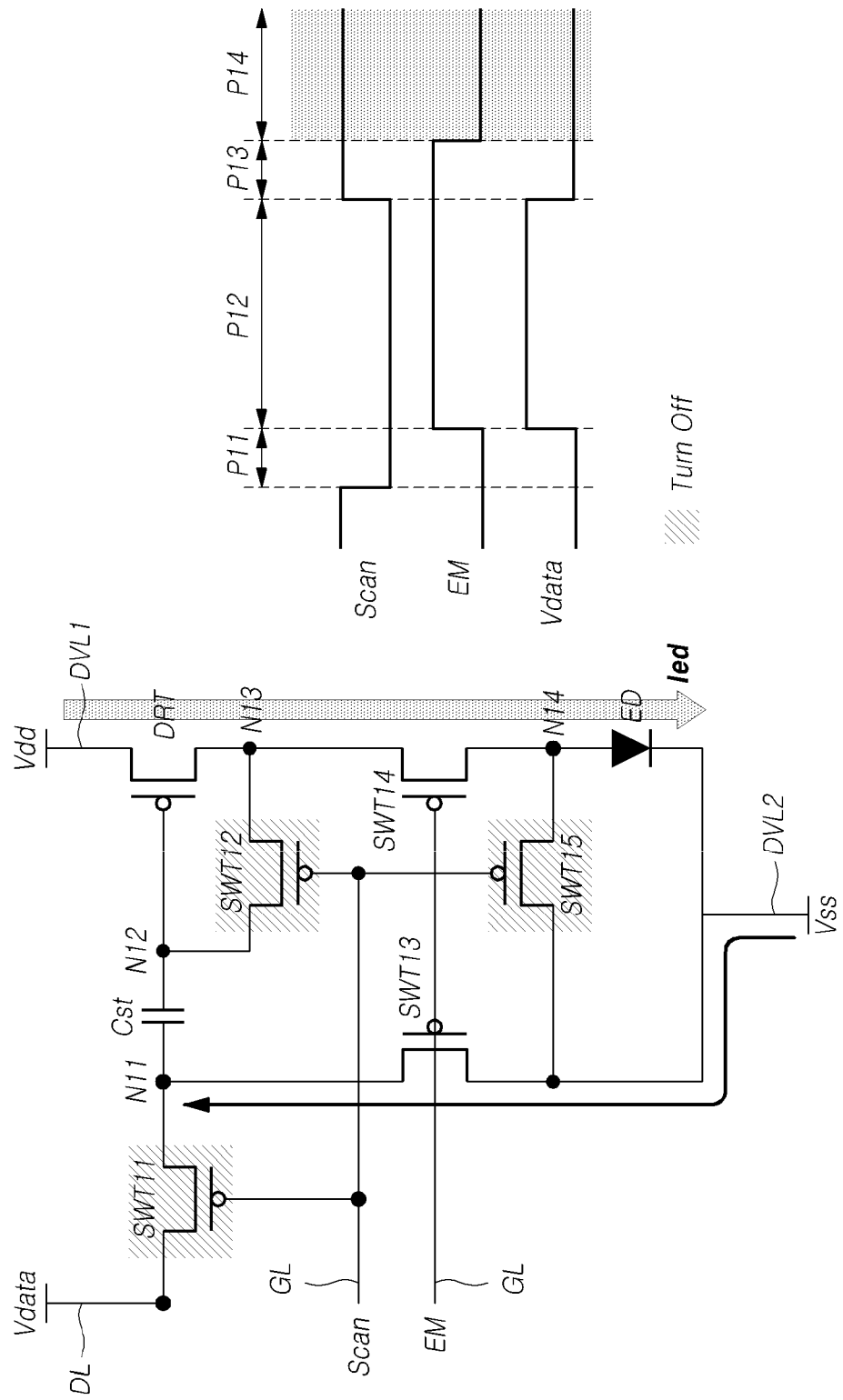

Referring to FIG. 4D, during a fourth period P14, the scan signal Scan may remain at a high level, and the light emitting signal EM may turn into a low level. Thus, the third switching transistor SWT13 and the fourth switching transistor SWT14 may be turned on.

Since the third switching transistor SWT13 is turned on, the voltage level at the first node N11 may turn from the data voltage Vdata to the second driving voltage Vss. The second node N12 may be coupled to the first node N11 and, thus, the voltage level at the second node N12 may be varied as the voltage at the first node N11 changes.

As an example, when the voltage variation at the first node N11 is $\Delta V(=Vdata-Vss)$, the voltage level at the second node N12 may change from (Vdd−Vth) to (Vdd−Vth−C'(Vdata−Vss)). Here, C'=C1/(C1+C2) where C1 may denote the capacitance of the capacitor Cst, and C2 may denote the capacitance between the gate and source electrode of the driving transistor DRT.

The driving transistor DRT may be driven according to the voltage level at the second node N12 and, as the fourth switching transistor SWT14 has been turned on, the driving current Ied may be supplied to the light emitting element ED. As the driving current is supplied to the light emitting element ED, the light emitting element ED may emit light. The fourth period P14 may be referred to as a "light emitting period."

Here, the driving current Ied may be calculated as in Equation 1 below:

$$Ied = k(Vdd-(Vdd-Vth-C'(Vdata-Vss))-Vth)^2 \quad \text{[Equation 1]}$$

Thus, since the driving current Ied supplied to the light emitting element ED is determined by the difference between the data voltage Vdata and the second driving voltage Vss, the brightness of the light emitting element ED may be controlled by the data voltage Vdata.

Since the subpixel SP is initialized using the second driving voltage Vss supplied via the second driving voltage line DVL2 electrically connected with the cathode electrode of the light emitting element ED, the number of voltage lines disposed in the subpixels SP may be reduced.

As the voltage line for supplying voltage for initialization is removed, the first driving voltage line DVL1 or second driving voltage line DVL2 which causes a large voltage variation level due to resistance may be widened. Thus, it may be possible to prevent brightness deviations due to differences in driving voltage level depending on the position of the subpixel SP.

By reducing the number of voltage lines, it is possible to maintain or increase the aperture ratio or transmittance of the subpixel SP while easily preventing adjacent voltage lines from being shorted.

The circuit structure that uses the second driving voltage Vss supplied to the second driving voltage line DVL2 to initialize the subpixel SP may be applicable to other various circuit structures than those described above.

FIG. 5 is a view illustrating another example circuit structure of a subpixel SP disposed in the display device 100 according to various embodiments of the disclosure. The circuit structure of the subpixel SP shown in FIG. 5 adds gate lines GL to the circuit structure of the subpixel SP of FIG. 3.

Referring to FIG. 5, similar to the subpixel SP of FIG. 3, a light emitting element ED is disposed in a subpixel SP, and five switching transistors SWT, one driving transistor DRT, and one capacitor Cst may be disposed in the subpixel SP.

A gate line GL for controlling the first switching transistor SWT11 and a gate line GL for controlling the second switching transistor SWT12 and the fifth switching transistor SWT15 may be disposed separately.

Thus, the first switching transistor SWT11 may be controlled by a first scan signal Scan1 supplied via the gate line GL. The second switching transistor SWT12 and the fifth switching transistor SWT15 may be controlled by a second scan line Scan2 supplied via the gate line GL.

The first scan signal Scan1 may be supplied at a high level during the first period P11 which is the initialization period and at a low level during the second period P12 which is the programming period. In other words, the first switching transistor SWT11 may be in the turned-on state only in the period during which the data voltage Vdata is supplied, by the first scan signal Scan1.

In the second period P12 to the fourth period P14, driving may be performed in the same manner as the subpixel SP shown in FIG. 3.

As such, even when the gate lines GL are added, such a structure may be applied in which the second driving voltage line DVL2 is used as a line for supplying voltage for initializing the subpixel SP.

Further, even in the structure of the subpixel SP which adds more switching transistors SWT, the embodiments of the disclosure may apply.

Figure 6:
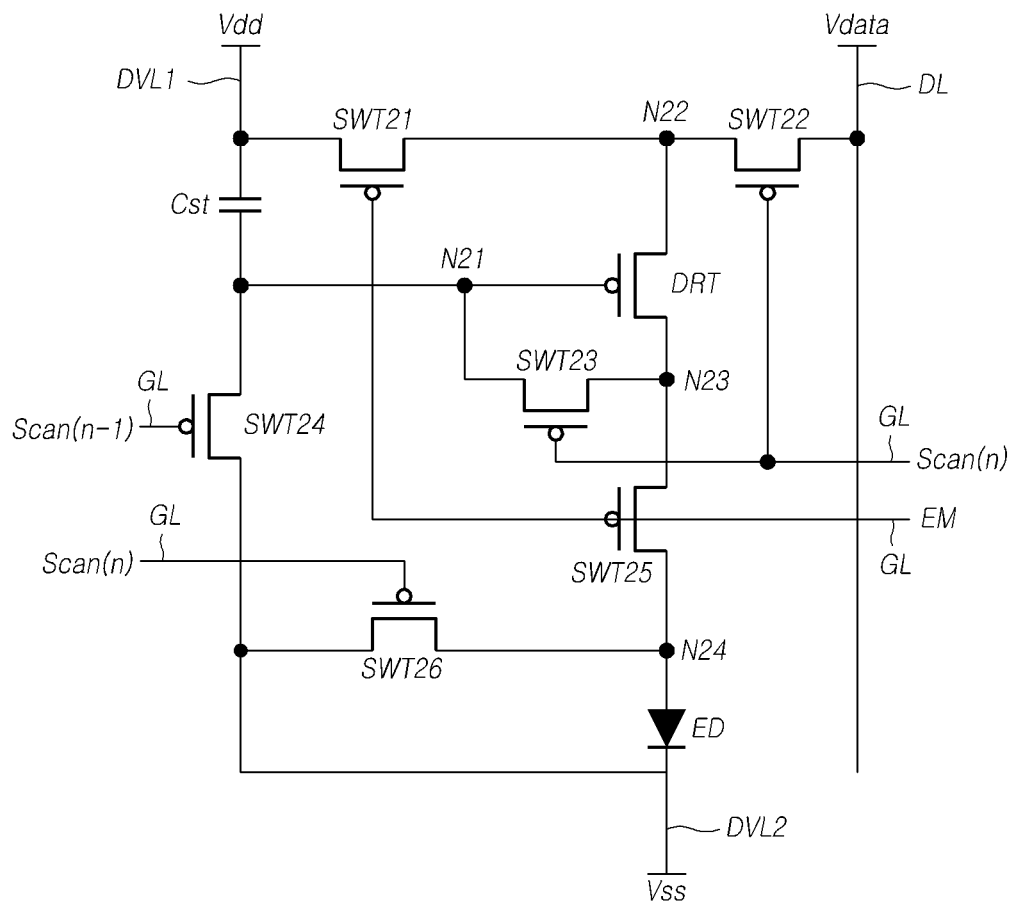
FIG. 6 is a view illustrating still another example circuit structure of a subpixel disposed in a display device according to various embodiments of the disclosure.

FIG. 6 is a view illustrating still another example circuit structure of a subpixel SP disposed in a display device 100 according to various embodiments of the disclosure.

Referring to FIG. 6, a light emitting element ED is disposed in a subpixel SP, and six switching transistors SWT, one driving transistor DRT, and one capacitor Cst may be disposed in the subpixel SP. In other words, FIG. 6 illustrates an example 7T1C structure.

The first switching transistor SWT21 may be electrically connected between the first driving voltage line DVL1 and the second node N22. The first switching transistor SWT21 may be controlled by a light emitting signal EM supplied to the gate line GL.

A second switching transistor SWT22 may be electrically connected between the data line DL and the second node N22 and be controlled by an nth scan signal Scan(n) supplied to the gate line GL.

A third switching transistor SWT23 may be electrically connected between the first node N21 and the third node N23 and be controlled by the nth scan signal Scan(n) supplied to the gate line GL.

A fourth switching transistor SWT24 may be electrically connected between the second driving voltage line DVL2 and the capacitor Cst. The fourth switching transistor SWT24 may be electrically connected to the first node N21. The fourth switching transistor SWT24 may be controlled by an (n−1)th scan signal Scan(n−1).

A fifth switching transistor SWT25 may be electrically connected between the third node N23 and the fourth node N24. The fifth switching transistor SWT25 may be controlled by the light emitting signal EM supplied to the gate line GL.

A sixth switching transistor SWT26 may be electrically connected between the second driving voltage line DVL2 and the fourth node N24. The sixth switching transistor SWT26 may be controlled by the nth scan signal Scan(n) supplied to the gate line GL.

The driving transistor DRT may be electrically connected between the second node N22 and the third node N23. The driving transistor DRT may be controlled by the voltage level of the first node N21.

The capacitor Cst may be electrically connected between the first driving voltage line DVL1 and the first node N21. The light emitting element ED may be electrically connected between the fourth node N24 and the second driving voltage line DVL2.

The second driving voltage line DVL2 may be electrically connected with the fourth node N24 corresponding to the anode electrode of the light emitting element ED via the sixth switching transistor SWT26.

The second driving voltage line DVL2 may be electrically connected with the capacitor Cst via the fourth switching transistor SWT24.

Thus, even when the circuit structure of the subpixel SP is 7T1C, the subpixel SP may be initialized by the second driving voltage Vss supplied to the second driving voltage line DVL2.

As the line for supplying voltage for initialization is removed, the width of the driving voltage line DVL may be widened to reduce resistance, or the aperture ratio or transmittance of the subpixel SP may be increased.

Figure 7A:
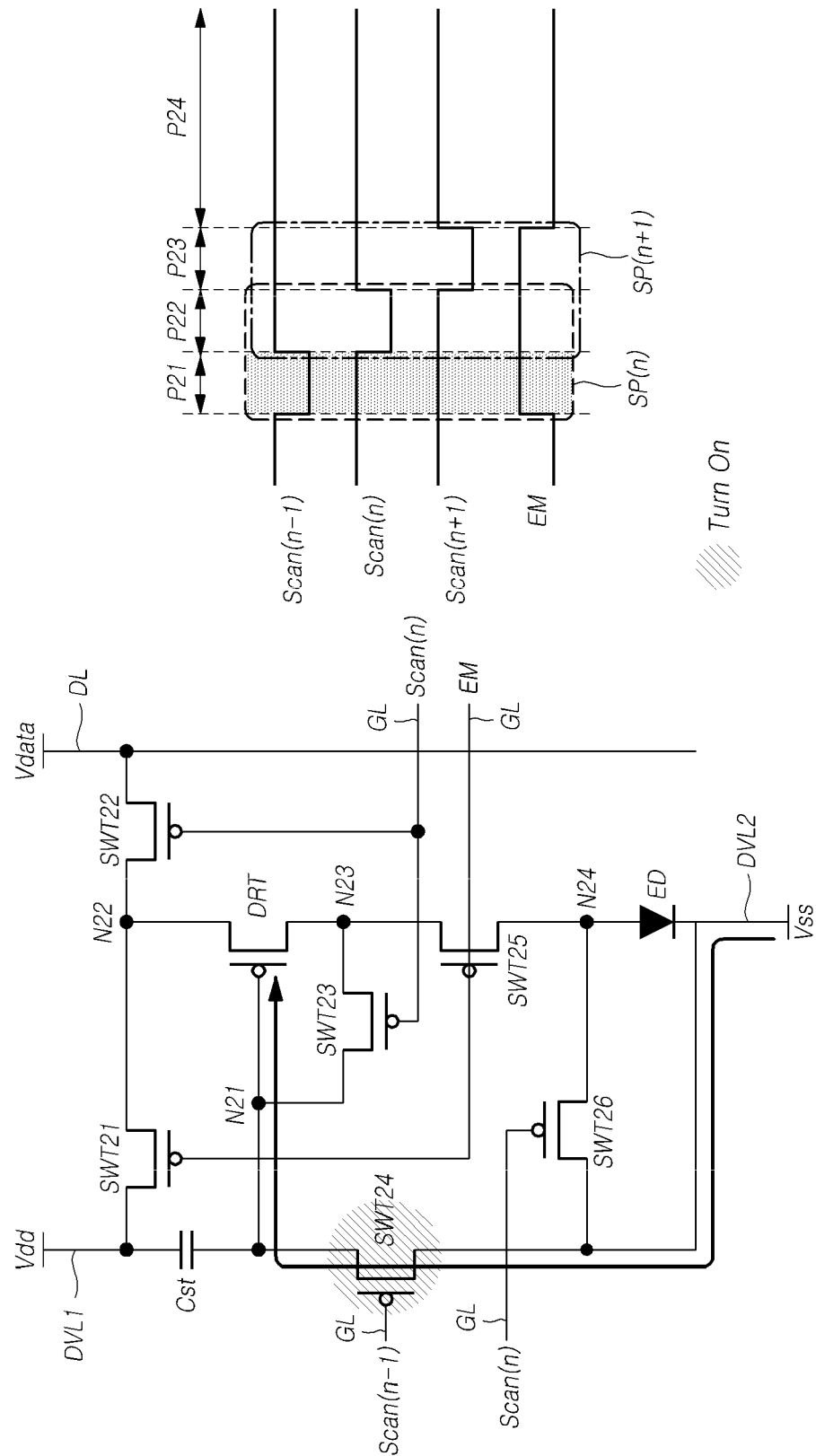
FIGS. 7A, 7B, and 7C are views illustrating an example scheme of driving a subpixel as shown in FIG. 6.
Figure 7B:
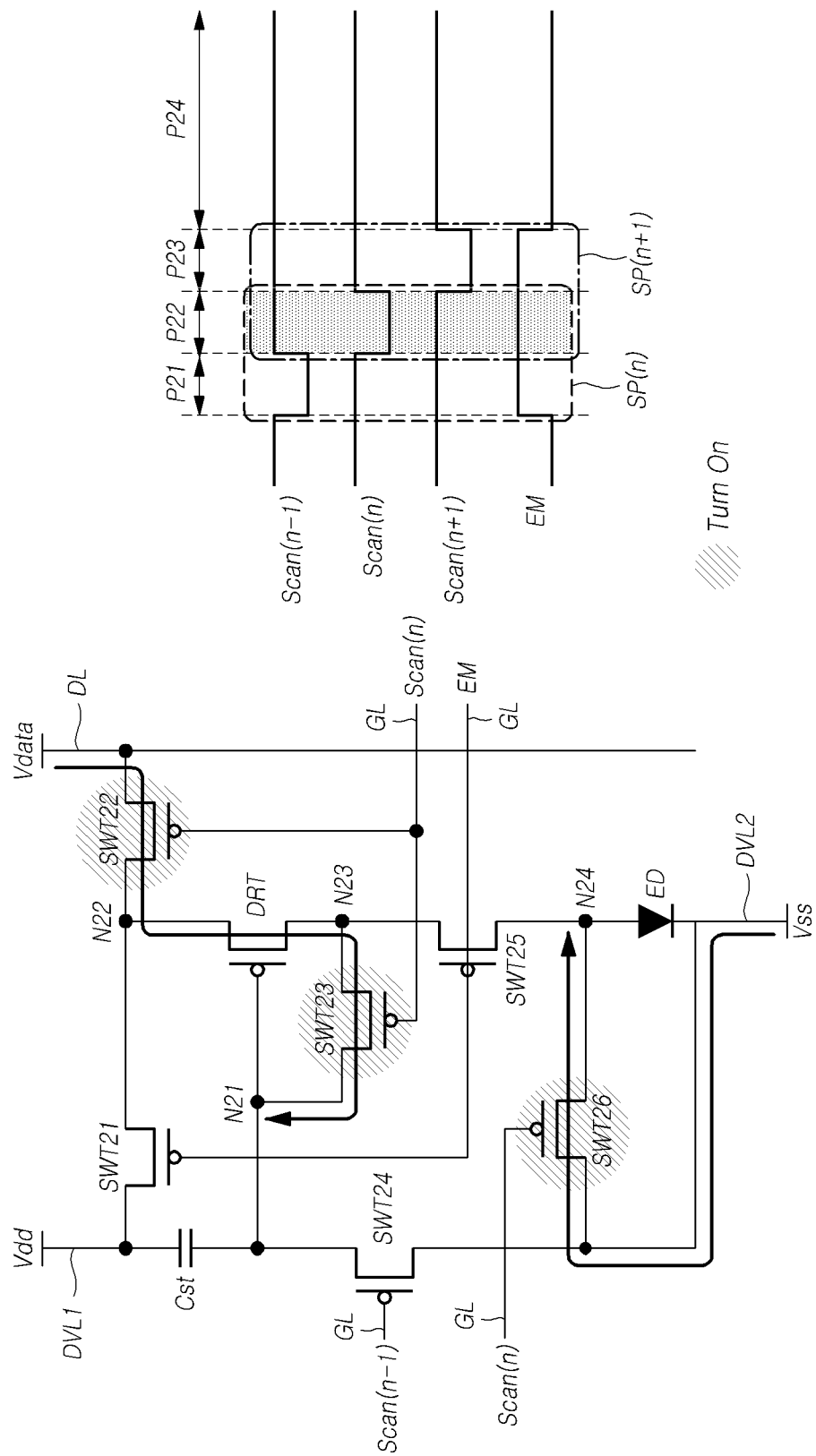
Figure 7C:
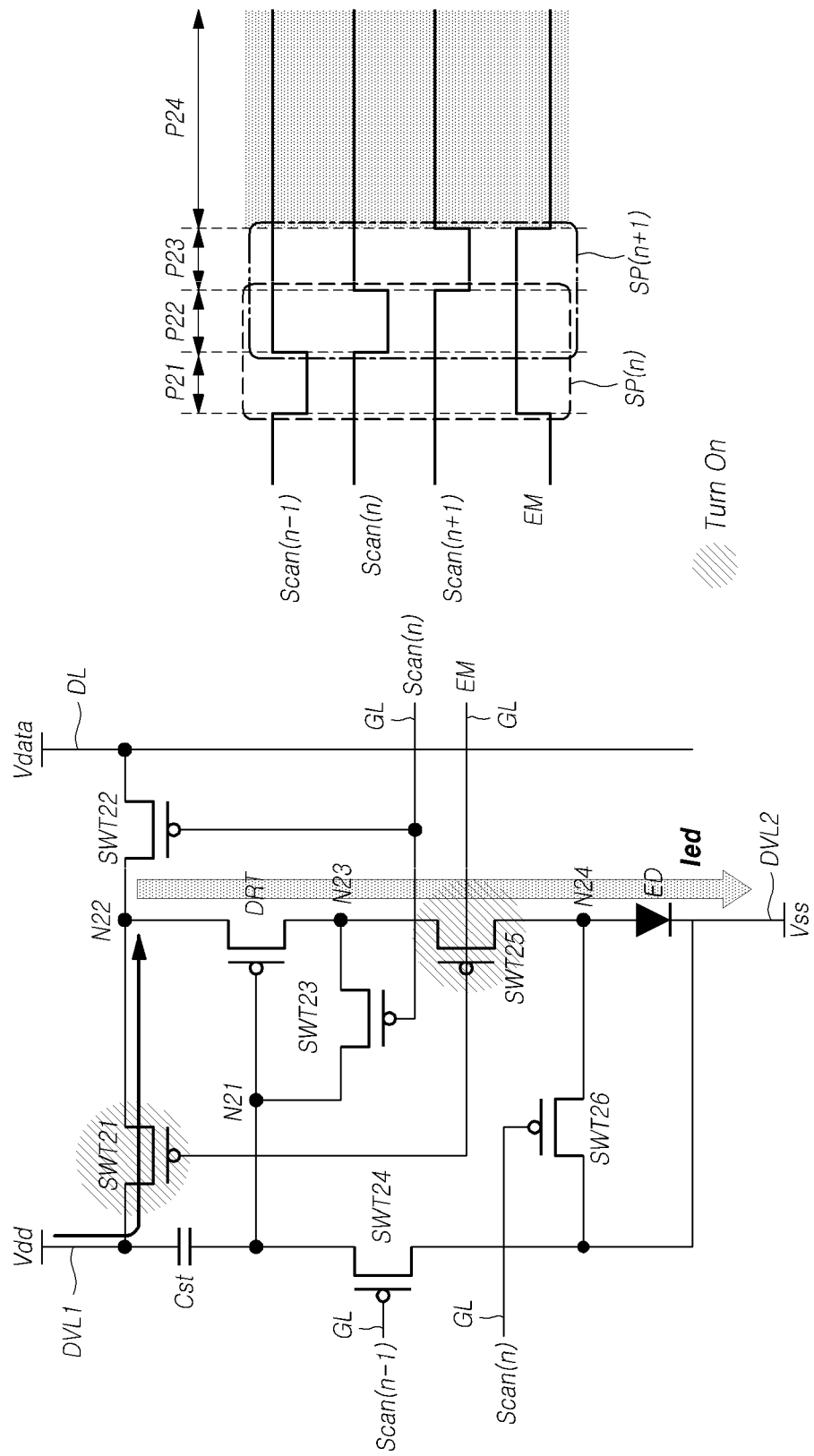

FIGS. 7A to 7C are views illustrating an example scheme of driving a subpixel SP as shown in FIG. 6.

Referring to FIG. 7A, during a first period P21, an (n−1)th scan signal Scan(n−1) may be supplied at a low level to the gate line GL.

Thus, the fourth switching transistor SWT24 may be turned on. As the fourth switching transistor SWT24 is turned on, the second driving voltage Vss may be supplied to the first node N21, which is the gate electrode of the driving transistor DRT.

During the first period P21, the first node N21 may be initialized by the second driving voltage Vss. The first period P21 may be referred to as an "initialization period."

Referring to FIG. 7B, during a second period P22, an nth scan signal Scan(n) may be supplied at a low level to the gate line GL.

As the nth scan signal Scan(n) is supplied at the low level, the sixth switching transistor SWT26 may be turned on.

Thus, the second driving voltage Vss may be supplied to the fourth node N24 which is the anode electrode of the light emitting element ED.

Further, as the nth scan signal Scan(n) is supplied at the low level, the second switching transistor SWT22 and the third switching transistor SWT23 may be turned on. Thus, the data voltage Vdata may be supplied to the first node N21 which is the gate electrode of the driving transistor DRT.

At this time, the data voltage Vdata subtracted by the threshold voltage Vth of the driving transistor DRT may be applied to the first node N21. Thus, compensation may be performed on the threshold voltage Vth of the driving transistor DRT.

The second period P22 may be referred to as a "programming period."

Here, the first period P21, the second period P22, and the third period P23 each may mean one horizontal period. Thus, while the (n−1)th scan signal Scan(n−1), the nth scan signal Scan(n), and the (n+1)th scan signal Scan(n+1) are sequentially supplied, programming may be carried out according to the data voltage Vdata.

After programming is complete, the light emitting element ED may be driven by the light emitting signal EM.

Referring to FIG. 7C, during the fourth period P24, a low-level light emitting signal EM may be supplied to the gate line GL while the scan signal Scan remains at a high level. Thus, the first switching transistor SWT21 and the fifth switching transistor SWT25 may be turned on.

Since the first switching transistor SWT21 is turned on, the first driving voltage Vdd may be supplied to the second node N22. Since the fifth switching transistor SWT25 is turned on, with the data voltage Vdata subtracted by the threshold voltage Vth of the driving transistor DRT applied to the first node N21, the driving current Ied may be supplied to the light emitting element ED while the driving transistor DRT is driven.

Thus, the light emitting element ED may emit light according to the driving current Ied. The fourth period P24 may be referred to as a "light emitting period."

Here, the driving current Ied may be calculated as in Equation 2 below:

$$Ied = k(Vdd - (Vdata - Vth) - Vth)^2 \quad \text{[Equation 2]}$$

Thus, since the driving current Ied supplied to the light emitting element ED is determined by the difference between the first driving voltage Vdd and the data voltage Vdata, the brightness of the light emitting element ED may be controlled by the data voltage Vdata.

Since the gate electrode of the driving transistor DRT or the anode electrode of the light emitting element ED is initialized using the second driving voltage Vss supplied via the second driving voltage line DVL2, the voltage line for supplying voltage for initialization may be removed.

By reducing the voltage lines for initialization, the width of the driving voltage line DVL may be increased, and variations in driving voltage due to the resistance of wires may be reduced. The reduction in the variations of driving voltage may prevent brightness deviations per area.

Further, removal of some voltage lines may facilitate placement of adjacent voltage lines while increasing the aperture ratio or transmittance of the subpixel SP.

In particular, when the subpixels SP disposed in the display device 100 include a transparent area, the proportion of the transparent area may be increased and, thus, a higher-transparency display device may be provided.

Figure 8:
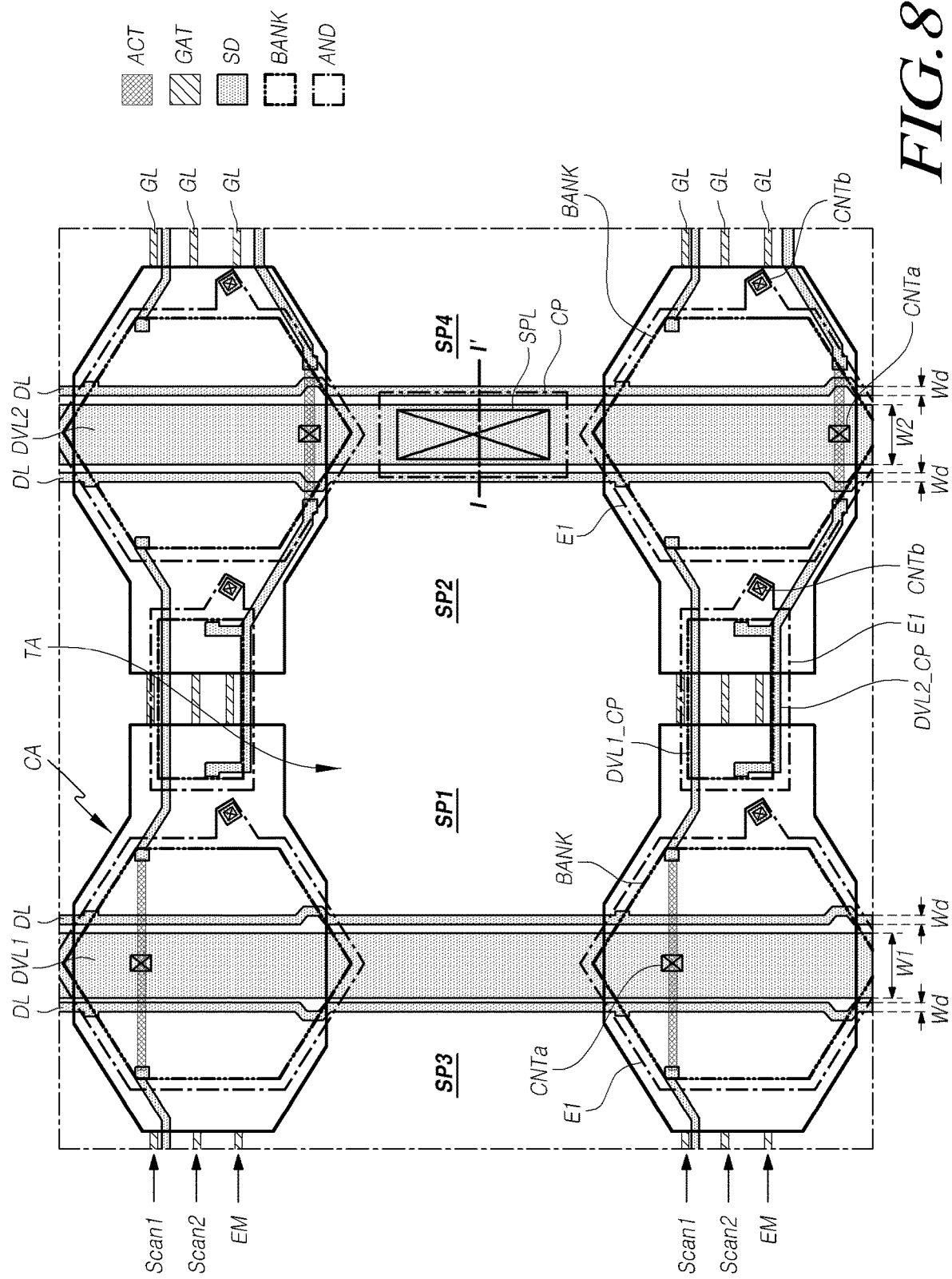
FIG. 8 is a layout view illustrating subpixels disposed in a display device according to various embodiments of the disclosure.
Figure 9:
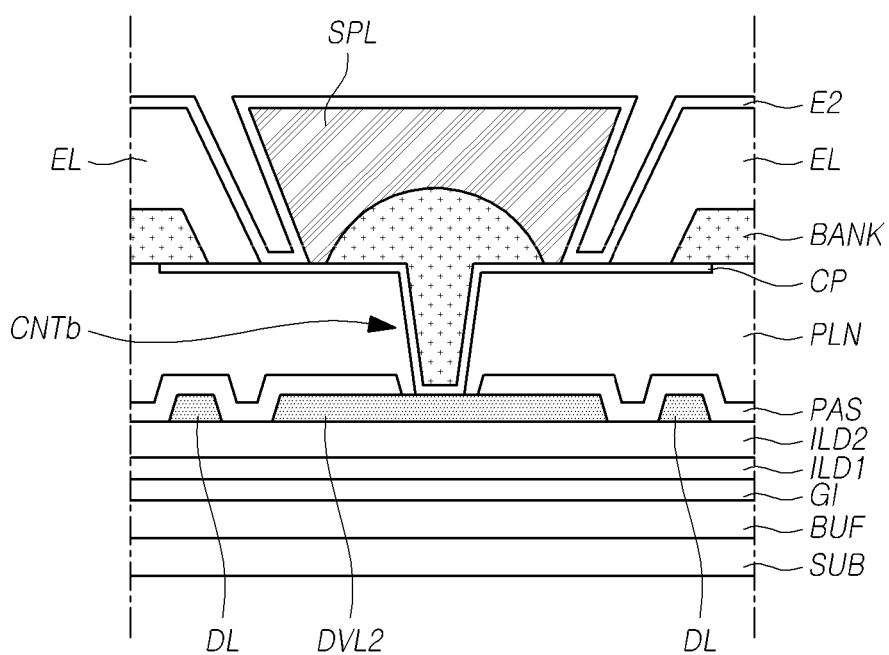
FIG. 9 is a cross-sectional view taken along line I-I' of FIG. 8.

FIG. 8 is a layout view illustrating subpixels SP disposed in a display device 100 according to various embodiments of the disclosure. FIG. 9 is a cross-sectional view taken along line I-I' of FIG. 8.

FIG. 8 illustrates an example structure in which a second driving voltage line DVL2 is used as a line for supplying voltage for initializing the light emitting element ED in the subpixel SP, in a layout corresponding to the circuit structure of the subpixel SP of FIG. 5. The drawing focuses on the structure of the first driving voltage line DVL1 and the second driving voltage line DVL2.

The subpixel SP may include a circuit area CA in which switching transistors SWT, a driving transistor DRT, and a capacitor Cst are arranged. The subpixel SP may include a transparent area TA where no circuit element is disposed.

The transparent area TA may be an area where cathode electrodes formed of a transparent insulation material or transparent material are disposed.

In the other area than the transparent area, signal lines, such as gate lines GL, data lines DL, and driving voltage lines DVL, may be arranged.

The gate lines GL may be formed of, e.g., a gate metal GAT. The data lines DL and the driving voltage lines DVL may be formed of, e.g., a source drain metal SD on the gate metal GAT. In other words, the driving voltage lines DVL and the data lines DL may be disposed in the same layer.

Each driving voltage line DVL may be disposed between two adjacent subpixels SP. The first driving voltage line DVL1 and the second driving voltage line DVL2 may be alternately disposed.

As an example, the first driving voltage line DVL1 may be disposed between the first subpixel SP1 and the third subpixel SP3. In other words, data lines DL may be disposed on both sides of the first driving voltage line DVL1.

The width W1 of the first driving voltage line DVL1 may be larger than the width Wd of the data line DL. This may lead to a reduction in the resistance of the first driving voltage line DVL1, thus decreasing variations in the first driving voltage Vdd supplied to the subpixel SP depending on the position of the subpixel SP.

The second driving voltage line DVL2 may be disposed between the second subpixel SP2 and the fourth subpixel SP4. Data lines DL may be disposed on both sides of the second driving voltage line DVL2.

Likewise, the width W2 of the second driving voltage line DVL2 may be larger than the width Wd of the data line DL. This may lead to a reduction in the resistance of the second driving voltage line DVL2, thus decreasing variations in the second driving voltage Vss supplied to the subpixel SP depending on the position of the subpixel SP.

The first driving voltage line DVL1 may be electrically connected with an active layer ACT, which is positioned thereunder, and a first driving voltage line connection pattern DVL1_CP, which is formed of the source drain metal SD positioned in the same layer, via a contact hole CNTa. The first driving voltage line DVL1 may supply a first driving voltage Vdd to the subpixels SP on both sides of the first driving voltage line DVL1.

The second driving voltage line DVL2 may be electrically connected with the active layer ACT, which is positioned thereunder, and a second driving voltage line connection pattern DVL2_CP, which is formed of the source drain metal SD positioned in the same layer, via a contact hole CNTa. The second driving voltage line DVL2 may supply a second driving voltage Vss to the subpixels SP on both sides of the second driving voltage line DVL2.

In other words, the first driving voltage line DVL1 and the second driving voltage line DVL2 may supply driving voltage to the first subpixel SP1 and the second subpixel SP2 disposed between the first driving voltage line DVL1 and the second driving voltage line DVL2.

Placement of the first subpixel SP1 and the second subpixel SP2 between the first driving voltage line DVL1 and the second driving voltage line DVL2 may provide a structure in which the transparent area TA of the first subpixel SP1 and the transparent area TA of the second subpixel SP2 are connected together in the direction crossing the driving voltage lines DVL. This may increase the transmittance of the subpixels SP while minimizing or reducing transmittance loss due to the layout of wires.

Further, the second driving voltage line DVL2 may be electrically connected with the third switching transistor SWT13 and fifth switching transistor SWT15 disposed in the subpixel SP, as in the example circuit structure of FIG. 5.

The second driving voltage line DVL2 may supply the second driving voltage Vss to the first node N11 of the capacitor Cst in a period during which the third switching transistor SWT13 is turned on. The first node N11 of the capacitor Cst may mean an electrode formed of the metal positioned on the gate metal GAT.

The second driving voltage line DVL2 may supply the second driving voltage Vss to the first electrode E1 of the light emitting element ED in a period during which the fifth switching transistor SWT15 is turned on. The first electrode E1 of the light emitting element ED may mean an electrode formed of the anode layer AND positioned on the source drain metal SD.

Here, the first electrode E1 of the light emitting element ED may be electrically connected with the fourth switching transistor SWT14 via a contact hole CNTb. As the first electrode E1 is disposed to overlap the circuit area CA other than the transparent area TA and the area where the driving voltage lines DVL are disposed, the transmittance of the subpixels SP may be increased.

As such, as the second driving voltage line DVL2 is used as a line for supplying voltage for initializing the subpixel SP, the number of voltage lines disposed in the active area AA may be reduced.

The reduction in the number of voltage lines leads to an increase in the width of the first driving voltage line DVL1 and the second driving voltage line DVL2, which may cause large voltage variations due to resistance, with the result of a decrease in resistance.

The resistance of the driving voltage lines DVL may be reduced by widening the lines, but without reducing the transparent areas TA. Thus, a high transmittance may be maintained, allowing for a transparent display device.

Upon supplying the second driving voltage Vss for initializing the subpixel SP, the second driving voltage line DVL2 may simultaneously supply the second driving voltage Vss to the cathode electrode of the light emitting element ED.

Thus, there may be an area where the second driving voltage line DVL2 and the cathode electrode are connected. As an example, the second driving voltage line DVL2 and the cathode electrode may be electrically connected with each other in the area except for where the first electrode E1 of the light emitting element ED is disposed on the second driving voltage line DVL2.

Referring to FIGS. 8 and 9, the second driving voltage line DVL2 and the second electrode E2, which is the cathode electrode of the light emitting element ED, may be electrically connected with each other between the second subpixel SP2 and the fourth subpixel SP4.

By way of example, various insulation layers, such as a buffer layer BUF, a gate insulation layer Gl, a first insulation layer ILD1, and a second insulation layer ILD2, may be disposed on the substrate SUB. The second driving voltage line DVL2 and data line DL, which are formed of the source drain metal SD, may be disposed on the second insulation layer ILD2. As set forth above, the second driving voltage line DVL2 may be larger in width than the data line DL.

A protection layer PAS and a flattening layer PLN may be disposed on the second driving voltage line DVL2, and the contact hole CNTb may be formed in the flattening layer PLN. A cathode electrode connection pattern CP made of an anode layer AND may be disposed on the contact hole CNTb.

A bank BANK and a light emitting element ED may be disposed on the cathode electrode connection pattern CP, and a portion of the cathode electrode connection pattern CP may be exposed for connection with the cathode electrode.

An inversely tapered spacer SPL may be disposed on the contact hole CNTb where the cathode electrode connection pattern CP is positioned. A cathode electrode may be deposited on the inversely tapered spacer SPL, allowing the second driving voltage line DVL2 to electrically connect to the second electrode E2 of the light emitting element ED.

As such, the second driving voltage line DVL2 may be electrically connected with the second electrode E2 of the light emitting element ED via the cathode electrode connection pattern CP positioned in a higher layer and with some switching transistors SWT disposed in the subpixel SP via, e.g., the active layer ACT positioned in a lower layer.

Thus, the second driving voltage line DVL2 may initialize the subpixel SP using the second driving voltage Vss supplied to the cathode electrode of the light emitting element ED, thereby leading to a reduction in the number of voltage lines disposed in the active area AA.

Even when the second driving voltage line DVL2 supplies voltage for initializing the subpixel SP, the driving current supplied to the light emitting element ED may not be affected.

Figure 10:
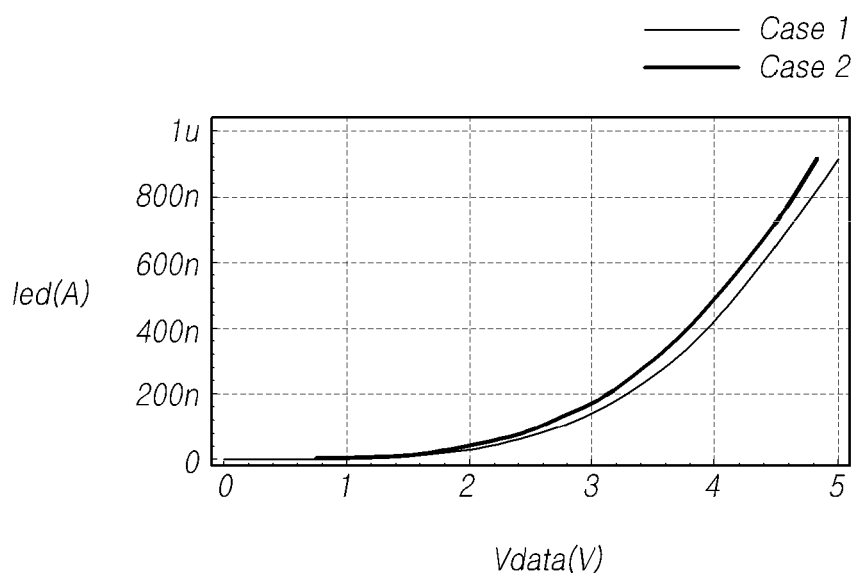
FIG. 10 is a view illustrating the results of simulation of a driving current supplied to a light emitting element according to a structure of a driving voltage line disposed in a display device according to various embodiments of the disclosure.

FIG. 10 is a view illustrating the results of simulation of a driving current supplied to a light emitting element ED according to a structure of a driving voltage line DVL disposed in a display device 100 according to various embodiments of the disclosure.

Referring to FIG. 10, Case 1 illustrates the results of simulation of variations in driving current Ied per data voltage Vdata, when a voltage line for supplying a second driving voltage Vss to the cathode electrode of a light emitting element ED is separated from a line for supplying voltage for initializing a subpixel SP.

Case 2 illustrates the results of simulation of variations in driving current Ied per data voltage Vdata, when a second driving voltage line DVL2 supplies the second driving voltage Vss to the cathode electrode of the light emitting element ED, and the second driving voltage Vss is used as a voltage for initializing the subpixel SP.

It may be identified from FIG. 10 that allowing the second driving voltage line DVL2 to supply voltage for initializing the subpixel SP does not influence the driving of the light emitting element ED.

Thus, according to the above-described embodiments of the disclosure, the number of voltage lines may be reduced by using the second driving voltage Vss supplied from the second driving voltage line DVL2 electrically connected with the cathode electrode of the light emitting element ED as voltage for initializing the subpixel SP.

The resistance of the driving voltage line DVL may be reduced by increasing the width of the driving voltage line DVL, as large an area as secured by reducing the number of voltage lines. Thus, voltage variations per resistance may be minimized or reduced, and an even or uniform brightness may be provided.

Further, the reduction in the number of voltage lines may increase, or at least maintain, the aperture ratio or transmittance of the subpixel SP, thus providing a scheme for implementing a display device 100 with higher light emission efficiency or a high-transmittance transparent display device.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
a display panel including a plurality of gate lines, a plurality of data lines, and a plurality of subpixels;
at least one first driving voltage line supplying a first driving voltage to the plurality of subpixels; and
at least one second driving voltage line supplying a second driving voltage to the plurality of subpixels, the at least one second driving voltage line electrically connected with a cathode electrode of a light emitting element disposed in a subpixel of the plurality of subpixels, and the at least one second driving voltage line electrically connected with an anode electrode of the light emitting element via at least one thin film transistor,
wherein the plurality of subpixels includes a first subpixel and a second subpixel,
wherein the first subpixel and the second subpixel are disposed between the first driving voltage line and the second driving voltage line that are adjacent to each other, and
each of the first subpixel and the second subpixel includes a circuit area and a transparent area.

2. A display device, comprising:
a display panel including a plurality of gate lines, a plurality of data lines, and a plurality of subpixels;
at least one first driving voltage line supplying a first driving voltage to the plurality of subpixels; and
at least one second driving voltage line supplying a second driving voltage to the plurality of subpixels, the at least one second driving voltage line electrically connected with a cathode electrode of a light emitting element disposed in a subpixel of the plurality of subpixels, and the at least one second driving voltage line electrically connected with an anode electrode of the light emitting element via at least one thin film transistor,
wherein the second driving voltage line is electrically connected with a capacitor disposed in the subpixel of the plurality of subpixels via at least one thin film transistor other than the thin film transistor electrically connected between the anode electrode of the light emitting element and the second driving voltage line.

3. The display device of claim 1, wherein one first data line of the plurality of data lines is disposed on at least one side of the first driving voltage line, and wherein the first driving voltage line is wider than the first data line.

4. The display device of claim 1, wherein one first data line of the plurality of data lines is disposed on at least one side of the second driving voltage line, and wherein the second driving voltage line is wider than the first data line.

5. The display device of claim 1, wherein the first driving voltage line and the second driving voltage line are alternately disposed.

6. The display device of claim 1, wherein the first subpixel is adjacent to the first driving voltage line, and the second subpixel is adjacent to the second driving voltage line,
the first driving voltage line supplies the first driving voltage to the first subpixel and the second subpixel, and the second driving voltage line supplies the second driving voltage to the first subpixel and the second subpixel,
the first driving voltage line supplies the first driving voltage to a third subpixel disposed opposite the first subpixel, with the first driving voltage line disposed between the first subpixel and the third subpixel, and
the second driving voltage line supplies the second driving voltage to a fourth subpixel disposed opposite the second subpixel, with the second driving voltage line disposed between the second subpixel and the fourth subpixel.

7. The display device of claim 1, wherein the second driving voltage line supplies the second driving voltage to an anode electrode of a light emitting element disposed in the first subpixel and an anode electrode of a light emitting element disposed in the second subpixel during at least some period other than a light emitting period.

8. The display device of claim 1, wherein at least one of a light emitting element disposed in the first subpixel or a light emitting element disposed in the second subpixel overlaps with a portion of at least one of the first driving voltage line, the second driving voltage line, a circuit area of the first subpixel, or a circuit area of the second subpixel.

9. The display device of claim 1, wherein a transparent area of the first subpixel and a transparent area of the second subpixel are connected together in a direction crossing the first driving voltage line and the second driving voltage line.

10. The display device of claim 1, wherein the second driving voltage line is electrically connected with the cathode electrode of the light emitting element via a cathode electrode connection pattern formed of a same material as the anode electrode of the light emitting element.

11. The display device of claim 10, further comprising an inversely tapered spacer disposed on a portion of the cathode electrode connection pattern.

12. The display device of claim 1, wherein each of the plurality of subpixels includes:
a driving transistor of which one of a source node or drain node is electrically connected with the first driving voltage line;
a capacitor including a first electrode and a second electrode, the first electrode of the capacitor electrically connected with a gate node of the driving transistor;
a first thin film transistor electrically connected between the second electrode of the capacitor and a first data line of the plurality of data lines;
a second thin film transistor electrically connected between the gate node of the driving transistor and the other one of the source node or drain node of the driving transistor;
a third thin film transistor electrically connected between a node between the capacitor and the first thin film transistor and the second driving voltage line;
a fourth thin film transistor electrically connected between the other one of the source node or drain node of the driving transistor and the anode electrode of the light emitting element; and
a fifth thin film transistor electrically connected between the anode electrode of the light emitting element and the second driving voltage line.

13. The display device of claim 12, wherein the second thin film transistor and the fifth thin film transistor are controlled by a scan signal supplied to a first gate line, and the third thin film transistor and the fourth thin film transistor are controlled by a light emitting signal supplied to a second gate line.

14. The display device of claim 1, wherein each of the plurality of subpixels includes:
a driving transistor;
a capacitor electrically connected between a gate node of the driving transistor and the first driving voltage line;
a first thin film transistor electrically connected between a node between the capacitor and the first driving voltage line and one of a source node or drain node of the driving transistor;
a second thin film transistor electrically connected between a node between the first thin film transistor and the driving transistor and a first data line of the plurality of data lines;
a third thin film transistor electrically connected between the gate node of the driving transistor and the other one of the source node or drain node of the driving transistor;
a fourth thin film transistor electrically connected between a node between the capacitor and the gate node of the driving transistor and the second driving voltage line;
a fifth thin film transistor electrically connected between the other one of the source node or drain node of the driving transistor and the anode electrode of the light emitting element; and
a sixth thin film transistor electrically connected between the anode electrode of the light emitting element and the second driving voltage line.

15. The display device of claim 14, wherein the first thin film transistor and the fifth thin film transistor are controlled by a light emitting signal supplied to a first gate line,
the second thin film transistor, the third thin film transistor and the sixth thin film transistor are controlled by a first scan signal supplied to a second gate line, and
the fourth thin film transistor is controlled by a second scan signal supplied to a third gate line.

16. The display device of claim 1, wherein the plurality of data lines, the at least one first driving voltage line, and the at least one second driving voltage line are disposed on a same layer.

17. A display device, comprising:
a display panel including a plurality of gate lines, a plurality of data lines, and a plurality of subpixels;
at least one first driving voltage line configured to supply a first driving voltage to the plurality of subpixels; and
at least one second driving voltage line configured to supply a second driving voltage to the plurality of subpixels,
wherein the at least one second driving voltage line comprises:
a first branch line electrically connected with a cathode electrode of a light emitting element disposed in a subpixel of the plurality of subpixels; and
a second branch line electrically connected with a capacitor disposed in the subpixel of the plurality of subpixels via at least one first thin film transistor; and
a third branch line electrically connected with an anode electrode of the light emitting element via at least one second thin film transistor other than the at least one first thin film transistor.

18. The display device of claim 17, wherein the at least one second driving voltage line supplies the second driving voltage to the capacitor during an initialization period and/or a light emitting period.

* * * * *